United States Patent [19]

Mehrgardt

[11] Patent Number: 4,694,475
[45] Date of Patent: Sep. 15, 1987

[54] FREQUENCY DIVIDER CIRCUIT
[75] Inventor: Soenke Mehrgardt, March, Fed. Rep. of Germany
[73] Assignee: Deutsche ITT Industries GmbH, Freiburg, Fed. Rep. of Germany
[21] Appl. No.: 861,152
[22] Filed: May 8, 1986
[30] Foreign Application Priority Data
  May 18, 1985 [EP] Euorpean Pat. Off. ........... 85106137
[51] Int. Cl.[4] .......................................... H03K 21/02
[52] U.S. Cl. ...................................... 377/48; 377/49; 377/55; 331/1 A
[58] Field of Search ....................... 377/47, 48, 49, 55; 331/1 A
[56] References Cited
U.S. PATENT DOCUMENTS

| 3,976,945 | 8/1976 | Cox | 377/48 |
| 4,101,838 | 7/1978 | Aihara et al. | 377/47 |
| 4,184,068 | 1/1980 | Washburn | 377/47 |
| 4,231,104 | 10/1980 | St. Clair | 377/48 |
| 4,423,381 | 12/1983 | Stepp et al. | 377/48 |
| 4,468,797 | 8/1984 | Shin | 377/47 |
| 4,556,984 | 12/1985 | Genrich | 377/47 |

Primary Examiner—John S. Heyman
Attorney, Agent, or Firm—Thomas L. Peterson

[57] ABSTRACT

A divider-by-factor frequency divider circuit is described. The rate-multiplier principle of eliminating pulses as regularly as possible from a number of pulses of the signal to be frequency-divided is modified so that low-frequency variations in the frequency-divided signal are reduced at the expense of an increase in higher-frequency variations. This modification is achieved through the addition of a second accumulator, a pair of adders, a subtracter and a presettable counter to the accumulator of a frequency divider circuit. A rate multiplier with a coloring characteristic inverse to pink noise is thereby obtained.

7 Claims, 1 Drawing Figure

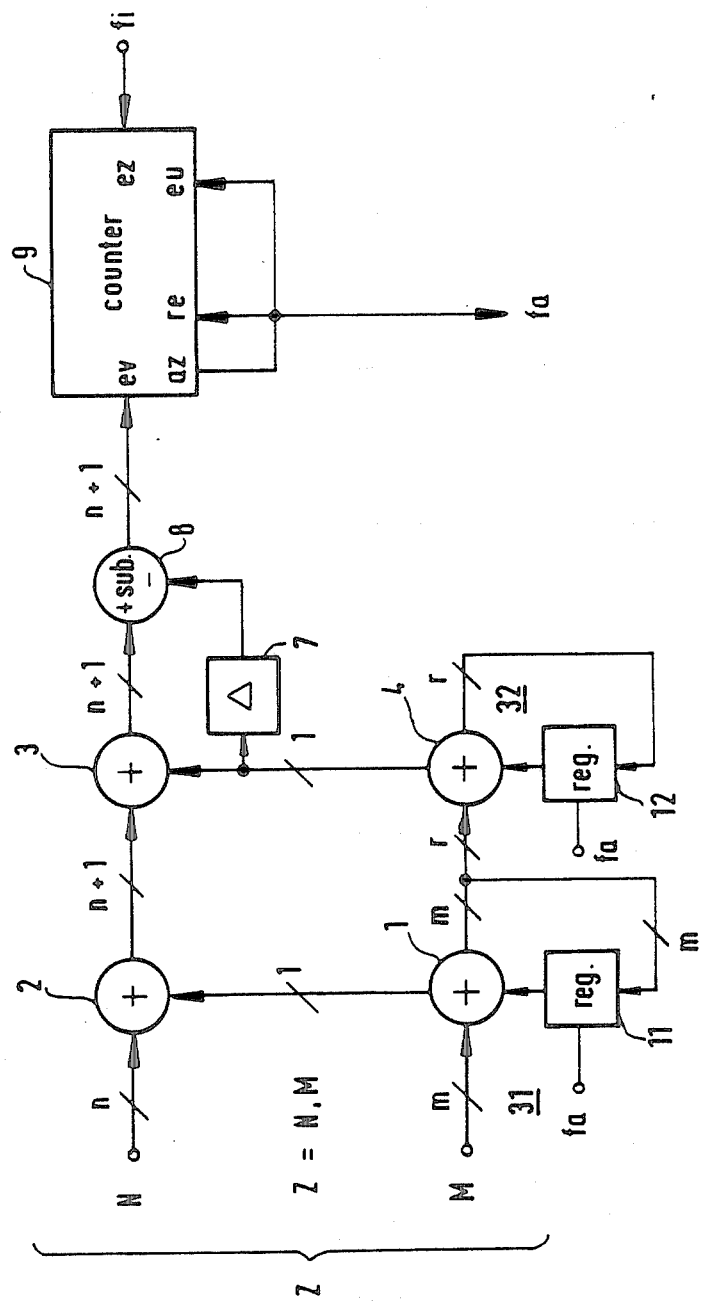

FREQUENCY DIVIDER CIRCUIT

BACKGROUND OF THE INVENTION

The invention pertains to a frequency divider circuit.

More specifically, the present invention relates to a frequency divider circuit for divisors consisting of an integral part and a fractional part. "ESSCIRC '82, Eighth European Solid-State Circuits Conference", Brussels, Sept. 22 through 24, 1982, pages 145 to 148, describes an arrangement of this kind which is designed as a rate multiplier. That arrangement utilizes a digital first accumulator consisting of a clocked data register and an m-bit first adder whose first input is presented with an m-bit first digital word corresponding to the fractional part of the divisor, and whose second input is fed from the output of the data register, whose input is connected to the output of the first adder.

As is well known, a rate multiplier has the property of eliminating q highly uniformly distributed pulses from p pulses of the signal to be frequency-divided, where q is smaller than p. If, for example, 66 pulses are to be eliminated during 100 input pulses, so that 33 output pulses are to be produced, the rate multiplier will provide first 32 output pulses at intervals of 3 input pulses and then 1 output pulse at an interval of 4 input pulses.

If the conventional rate multiplier is used in a phase-locked loop to produce a frequency- and phase-stable clock signal, the following problem arises: For the above duration of 32 output pulses at intervals of 3 input pulses, the phase-locked loop will adjust itself to a zero phase error if the circuit has a suitable time constant. For the duration of the four input pulses, however, a large phase error (jitter) will be present.

SUMMARY OF THE INVENTION

It is, therefore, one object of the invention to provide a frequency divider circuit which does not eliminate uniformly distributed pulses like a rate multiplier but eliminates pulses which are distributed in a manner better suited for the exemplary application in phase-locked loops.

In accordance with the invention, the rate-multiplier principle of eliminating pulses as regularly as possible from a number of pulses of the signal to be frequency-divided is modified so that low-frequency variations in the frequency-divided signal are reduced at the expense of an increase in higher-frequency variations.

BRIEF DESCRIPTION OF THE DRAWING

The invention and its advantages will now be explained in more detail with reference to the sole FIGURE of the accompanying drawing which shows a block diagram of an embodiment of the invention.

Detailed Description

The divisor by which the signal fi is to be frequency-divided to obtain the signal fa consists of an integral part. It is thus a rational number which must be greater than or equal to three and is thought of as being present in decimal point representation for the purposes of the invention. It corresponds to the digital word Z which is fed to the frequency divider circuit and consists of the m-bit digital word M, corresponding to the fractional part of the divisor, and the n-bit digital word N, corresponding to the integral part of the divisor, so that the usual representation $Z=N\cdot M$ is obtained.

The first adder 1 and the first data register 11 form the first digital accumulator 31 whose input is identical with the first input of the adder 1. This input is supplied with the first digital word M, which is accumulated in step with the frequency-divided signal fa which clocks the data register 11, because the output of the adder 1 is connected to the input of the data register 11, so that the output signal fo the adder 1 is transferred into the register 11 and applied to the second input of the adder 1 on each clock pulse.

The second digital word N is fed to the first input of the n-bit second adder 2, which has its second input connected to the carry output of the first adder 1. Its output is coupled to the first input of the (n+1)-bit third adder 3.

The first accumulator 31 is followed by the second accumulator 32, which consists of the fourth adder 4 and the second data register 12; the latter, like the first data register 11, is clocked by the frequency-divided signal fa. The fourth adder 4 is an r-bit adder, with the following relation holding for r: $1 \leq r \leq m$. The first input of this adder is presented with r most significant bits of the output signal of the first accumulator 11. The carry output of this adder is coupled to the second input of the third adder 3 and, through the delay element 7, to the subtrahend input of the subtractor 8. The delay of the delay element 7 is equal to the respective period of the frequency-divided signal fa. The minuend input of the subtracter 8 is connected to the output of the third adder 3.

The output of the subtracter 8 is coupled to the preset input ev of the presettable counter 9, whose count input ez is presented with the signal to be frequency-divided, fi. The frequency-divided signal fa appears at that counter output az at which a pulse occurs after a number of pulses equal to the value applied to the preset input ev. This counter output az is connected both to the reset input re and to the enable input eu, so that, on the occurence of each pulse at this output, the counter vz, provided that it is an up counter, is reset and the digital word then present at the preset input ev is transferred into the counter vz. If the counter 9 is implemented with a down counter, the counter output az is identical with the zero output, so that the connection with the reset input and/or the latter itself can be dispensed with.

Through the addition of the second accumulator 32, the adders 2, 3, the subtracter 8, and the presettable counter 9 to the acumulator 31, the frequency divider circuit has the desired pulse-elimination scheme which differs from the property of the rate multiplier. With these additional subcircuits, a rate multiplier with so-called noise coloring is obtained, this coloring of the frequency characteristic being inverse to pink noise. This means that the amplitudes of low-frequency noise signals are reduced from those of white noise at the expense of an increase in the amplitudes of noise signals of higher frequency. If the frequency-divider circuit in accordance with the invention is used in a phase-locked loop, the output of the latter thus provides a low-jitter signal of high frequency stability and very high frequency setting accuracy, because the low frequency variations in the frequency-divided output signal fa are greatly reduced.

The invention can be implemented to advantage with monolithic integrated circuits; as it used exclusively digital subcircuits, it is especially suited to integration in insulated-gate field-effect transistor technology (MOS technology).

In the FIGURE, the numbers at the diagonals in the interconnecting leads show how many bits the digital signals on these leads have and how many conductors the corresponding buses must thus consist of if parallel processing is performed.

What is claimed is:

1. Frequency divider circuit for divisors consisting of an integral part and a fractional part which is designed in the manner of a rate multiplier and comprises:

a digital first accumulator including a clocked data register and an m-bit first adder having a first input presented with an m-bit first digital word corresponding to the fractional part of the divisor, and having a second input fed from the output of said data register, the input of said data register being connected to the output of said first adder said first accumulator having a sum output;

an n-bit second having a first input receiving an n-bit second digital word corresponding to the integral part of said divisor and having a second input connected to the carry output of said first adder;

an n+1 bit third adder having a first input coupled to the output of said second adder, said third adder having a second input and an output;

a subtracter having its minuend input coupled to the output of said third adder output, said subtracter having a subtrahend input and an output;

a presettable counter having its preset input coupled to the output of said subtracter output, and having a count input receiving a signal to be frequency divided;

said counter having a counter output at which a pulse occurs after a number of pulses equal to the value applied to said preset input, output pulses at said counter output being the frequency-divided signal;

said frequency divided signal clocking said data register, and;

an r-bit second accumulator, wherein $1 \leq r \leq m$, having an input receiving the r most significant output bits of said first accumulator sum output, and having a carry output coupled to a second input of said third adder and coupled to the subtrahend input of said subtracter; and a delay means disposed between said second accumulator carry output and said subtracter subtrahend input, said delay means having a delay equal to the period of said frequency divided signal.

2. A frequency divider circuit in accordance with claim 1, wherein said second accumulator includes:

a second clocked data register; and an r-bit fourth adder having a first input coupled to the r most significant bits of said sum output of said first adder, a second input coupled to the output of said second data register, a sum output coupled to the input of said second data register, and a carry output connected as said second accumulator carry output.

3. A frequency divider in accordance with claim 2, wherein:

said frequency divided signal clocks said first and second data registers.

4. An adjustable frequency divider for use in a phase-locked loop, said frequency divider comprising:

a digital first accumulator having a first input receiving an m-bit first digital word corresponding to the fractional part of the divisor, said digital first accumulator having a first sum output and a first carry output;

a digital second accumulator having a first input coupled to said first sum output and receiving the r most significant bits of said first sum output, said second digital accumulator having a second sum output and a second carry output;

an n-bit second adder having a first input receiving an n-bit second digital word corresponding to the integral part of said divisor and having a second input coupled to said first carry output;

an n+1 bit third adder having a first input receiving the output of said second adder, and a second input receiving said second carry output;

delay means;

a subtracter having it minuend input coupled to the output of said third adder and its subtrahend input coupled to said second carry output by said delay means;

a presettable counter having its preset input coupled to the output of said subtracter, a count input receiving the signal to be frequency divided and an output, said counter output being the frequency divided signal.

5. An adjustable frequency divider in accordance with claim 4, wherein:

said first accumulator comprises a first adder and a first register, said first register having its input connected to said first adder output and its output connected to one of said first adder inputs;

said second accumulator comprises a second adder and a second register, said second register having its input connected to said second adder output and having its output connected to one of said second adder inputs.

6. An adjustable frequency divider in accordance with claim 4, wherein:

said counter is an up counter and said counter includes reset and enable inputs both connected to said counter output such that on the occurance of each pulse at said counter output, said counter is reset and the digital word at said preset input is transferred into said counter.

7. A frequency in accordance with claim 5, wherein: said frequency divided signal clocks said first and second data registers.

* * * * *